United States Patent [19]

Merlin et al.

[11] Patent Number: 4,955,692
[45] Date of Patent: Sep. 11, 1990

[54] QUASI-PERIODIC LAYERED STRUCTURES

[75] Inventors: Roberto Merlin; Roy Clarke, both Ann Arbor, Mich.

[73] Assignee: The University of Michigan, Ann Arbor, Mich.

[21] Appl. No.: 898,015

[22] Filed: Aug. 19, 1986

[51] Int. Cl.[5] .............................................. G02B 1/10
[52] U.S. Cl. ..................................... 350/166; 350/164
[58] Field of Search ................ 350/165, 164, 166, 320

[56] References Cited

U.S. PATENT DOCUMENTS 4,189,205  2/1980  Vandehei ........................... 350/164
4,431,258  2/1984  Fye ...................................... 350/1.6

OTHER PUBLICATIONS

Merlin et al., "Quasiperiodic GaAs–AlAs Heterostructures"; Physical Review Letters, vol. 25, No. 17; Oct. 21, 1985; pp. 1768–1770.

Machida et al., "Phonons in One-Dimensional Quasi-Lattices"; Journal of the Physical Society of Japan, vol. 55, No. 6, Jun. 1986 pp. 1799–1801.

Nori et al., "Acoustic and Electronic Properties of One-Dimensional Quasicrystals"; Physical Review B, vol. 34, No. 4, Aug. 15, 1986, pp. 2207–2211.

*Primary Examiner*—Bruce Y. Arnold
*Assistant Examiner*—Terry S. Callaghan
*Attorney, Agent, or Firm*—Rohm & Monsanto

[57] ABSTRACT

A quasi-periodic sequence of a plurality of types of layers is produced by selecting successive subsequences of the layers in response to at least one prior subsequence of the layers and a predetermined substitution matrix. In one specific illustrative embodiment, the substitution matrix is such that each successive term of a series corresponds to a Fibonacci sequence. Quasi-periodic structures produced in accordance with the present invention are produced simply and inexpensively without the need for very stringent manufacturing tolerances and controls. Optical embodiments of the invention yield highly desirable characteristics with respect to incident radiation in the ranges of X-rays, ultaviolet, and visible light. Additionally, electrical devices having unusual electrical characteristics can be produced.

17 Claims, 1 Drawing Sheet

QUASI-PERIODIC LAYERED STRUCTURES

GOVERNMENT RIGHTS IN THE INVENTION

This invention was made with Government support under Contract Number DAAG29-85-K-0175, awarded by the Department of the Army. The Government has certain rights in this invention.

BACKGROUND OF THE INVENTION

This invention relates generally to a wide variety of structures and devices formed of layers of materials and more particularly, to systems, devices, arrangements, coatings, and a variety of other items which utilize layered structures, particularly quasi-periodic layered structures.

Layered structure arrangements find application in a vast array of devices and systems throughout a variety of technical disciplines. For example, a variety of electronic components and microcircuit systems are formed by applying plural layers of semiconductor material. Similarly, such layering is commonly used in the production of photoconductive devices and optical devices, such as lenses, particularly coatings therefor, mirrors, optical filters, and fiber optic cladding.

It is well known that the response characteristic of layered devices depend to a substantial extent upon the arrangement of the layers as a sequence, the thickness of the layers, and the composition of the layers. It is known that a variety of desirable device characteristics may be achieved if a non-periodic, or quasi-periodic layering arrangement could be effected. For example, in the electronic devices field, quasi-periodic layering of semiconductor materials may be useful in achieving negative differential resistance effects. In the field of optics, the use of quasi-periodic layering arrangements on lenses, mirrors, and filters may result in advantageous optical characteristics, in preselected spectral regions. For example, a power law frequency response characteristic may be achieved with the use of such quasi-periodic layering.

In the field of optics, there is a need for a versatile coating system which can be tailored to specific needs. The present state of this technology, for electromagnetic surface coatings, is based on homogeneous layers of precisely controlled thickness, or on multiple layers which are deposited in a periodic fashion. These known configurations limit the performance efficiency of the resulting device and limit the operating range to narrow bandwidths. Such limitations are particularly severe in the X-ray and hard ultraviolet region of the spectrum. There is currently no satisfactory general solution to the problem of fabricating high efficiency X-ray mirrors and other components at these frequencies.

It is, therefore, an object of this invention to provide a simple and economical system for achieving the advantages of quasi-periodic structures.

It is another object of this invention to provide a system having selectable surface properties.

It is also an object of this invention to provide a coating system having a tailorable electromagnetic response characteristic.

It is a further object of this invention to provide a coating system which is less sensitive than known arrangements to defects and irregularities.

It is additionally an object of this invention to provide a thin film structure having a characteristic with a very high density of Fourier peaks.

It is yet another object of this invention to provide a quasi-periodic arrangement of optical layers.

It is still a further object of this invention to provide a quasi-periodic arrangement of metallic layers.

It is also another object of this invention to provide a quasi-periodic arrangement of semiconductor layers.

It is also an additional object of this invention to provide a quasi-periodic arrangement of dielectric layers.

It is yet a further object of this invention to provide a quasi-periodic arrangement of transparent oxides.

It is still another object of this invention to provide a multilayer coating which exhibits quasi-periodic characteristics formed by molecular beam epitaxy.

Another object of this invention is to provide a multilayer coating exhibiting quasi-periodic characteristics formed by sputtering.

A further object of this invention is to provide a multilayer coating exhibiting quasi-periodic characteristics formed by chemical vapor deposition.

An additional object of this invention is to provide a multilayer coating exhibiting quasi-periodic characteristics formed by liquid phase epitaxy.

Still another object of this invention is to provide a multilayer coating exhibiting quasi-periodic characteristics formed by aerosol coating.

A yet further object of this invention is to provide a multilayer device characterized by power law behavior.

SUMMARY OF THE INVENTION

The foregoing and other objects are achieved by this invention which provides a system for producing multilayer devices which exhibit quasi-periodic behavior. In accordance with a device aspect of the invention, the device is provided with pluralities of first and second layers, the layers having respective first and second predetermined characteristics. For example, the predetermined characteristics which define the first and second layers may include layer thickness, layer material, combinations of layer materials, or any other characteristics. The first and second layers are arranged in accordance with a sequence of groupings of layers, each grouping being configured, with respect to its sequence of layers, in response to the configuration of a sequentially prior grouping of the first and second layers, in accordance with a matrix having a nonzero determinant.

In a specific illustrative example of a multilayer device constructed in accordance with the invention, a first layer arrangement having a first predetermined characteristic is succeeded by a second layer arrangement which has a second predetermined characteristic. The second layer arrangement may, in certain embodiments, include one of the first layer arrangements. A third layer arrangement is subsequently produced formed of a predetermined combination of the first and second layer arrangement. Subsequently, a fourth layer arrangement is produced formed of a predetermined combination of the second and third layer arrangements. This sequence of layer arrangements, where each succeeding layer arrangement is configured in response to one or more prior layer arrangements, is continued until a desired total number of layers is achieved.

One significant advantage of the present invention is that it affords selectability of the characteristics of the resulting device, or its surface properties. For example, the present invention can be applied to produce X-ray mirrors and other components at X-ray and other frequencies. The optical devices which result from the application of the present invention can be configured to produce high reflectivity at certain frequencies, and low reflectivity at others. Quasi-periodic coatings are inherently more versatile than known single layer or periodic multilayer coatings, and permit tailoring of the electromagnetic response characteristerics of the surface for particular applications. Moreover, the Fourier spectrum of quasi-periodic coatings is inherently less sensitive to defects and irregularities than periodic multilayer coatings. Thus, manufacturing tolerances and fabrication conditions need not be as stringent as for existing optical coatings.

In accordance with the invention, successive sequences of layers can be predetermined with the use of a square substitution matrix having the form N by N wherein N corresponds to the number of types of layers. For example, in an embodiment of the invention where only two types of layers are used, a thick layer A and a thin layer B, the substitution matrix would be a 2×2 matrix. It is essential that the determinant of the square matrix not be zero otherwise periodicity is achieved.

In a specific illustrative example, for purposes of subsequent layer arrangements, a thick layer A will be translated into a thick layer and a thin layer AB, and a thin layer B will be translated into two thick layers AA. This can be expressed as follows:

$A \rightarrow AB$ $A \rightarrow AA$

This can be represented by the following substitution matrix.

|              | A | B |
|--------------|---|---|
| A changes to | 1 | 1 |
| B changes to | 2 | 0 |

The determinant of this matrix is, $(1 \times 0) - (2 \times 1) = -2$, and therefore is nonzero. Such substitutions will therefore not result in a periodic arrangement. Moreover, the first element of the matrix is unity, and none of the elements are negative. Beginning with a first layer A, the second layer arrangement is AB. The third layer arrangement, in accordance with the substitution matrix is ABAA. This continues until a desired number of layers, or a desired device thickness, is reached. For this specific example, the sequence proceeds as follows:

| LAYER GENERATION NUMBER | LAYER ARRANGEMENT COMPOSITION |
|---|---|
| 1 | A |
| 2 | AB |
| 3 | ABAA |
| 4 | ABAAABAB |

It is to be noted that the invention herein is not limited in any way to the foregoing specific illustrative example. Thus, any number can be substituted in a square substitution array to meet specific application requirements, as long as the determinant of the matrix is not zero. Additionally, in certain embodiments some or all of the layer arrangements may be applied to the device in reverse order without eliminating quasi-periodicity.

In accordance with a method aspect of the invention, a multilayer structure is formed by applying a first layer arrangement having a first predetermined characteristic. Subsequently, a second layer arrangement is applied having a second predetermined characteristic. The sequence is continued with the application of a third layer arrangement having a third predetermined characteristic which is responsive to the first and second predetermined characteristics. In this manner, each successive layer arrangement has an associated predetermined characteristic which is responsive to the characteristics of prior layer arrangements. As previously indicated, the predetermined characteristics may include layer thickness, layer material, combinations of layer materials, or any other distinguishing characteristic. It is to be noted that each layer, as well as each layer arrangement, which may consist of a plurality of layers, have predetermined characteristics A resulting device may have layers deposited in accordance with a combination of layer generations, or only one layer generation in certain embodiments.

In accordance with a further method aspect of the invention, a characteristic is defined for each of N types of layers. Additionally, a substitution matrix is defined which specifies successive sequences of the N types of layers. The N types of layers are then produced, or deposited, in a sequence specified by the substitution matrix. Any deposition scheme may be used such as sputtering, molecular beam epitaxy, metallization, aerosol deposition, chemical vapor deposition, or liquid phase epitaxy. Additionally, layers may be grown, as is customary in the semiconductor fabrication art.

BRIEF DESCRIPTION OF THE DRAWING

Comprehension of the invention is facilitated by reading the following detailed description in conjunction with the annexed drawing, in which:

FIG. 3 is a plot of X-ray reflectivity for a quasi-periodic surface coating using the layers of FIGS. 2 and 3.

DETAILED DESCRIPTION

Figure 1:
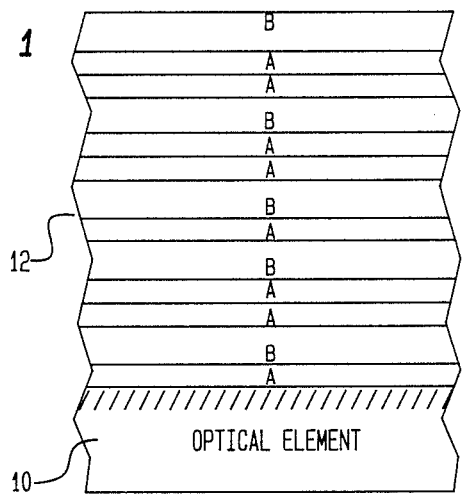
FIG. 1 is a schematic representation of a quasi-periodic electromagnetic coating on a surface of an optical element.

FIG. 1 is a schematic representation of a specific illustrative embodiment of the invention wherein an optical element 10 is coated with a plurality of layers 12. Layers 12 are of two types, A and B, and are arranged in a predeterminable quasi-periodic sequence. In this specific embodiment, the sequence of layers follows a mathematical progression known as a Fibonacci series, wherein successive terms in the series are defined by the equation:

$F_{n-2} + F_{n-1} = F_n$

In essence, each successive term in the series is formed by combining the two immediately prior terms. The sequence can be restated as being in accordance with the following substitution matrix:

|              | A | B |
|--------------|---|---|
| A changes to | 1 | 1 |
| B changes to | 1 | 0 |

Applying the substitution matrix to develop a sequence of layers results in the following levels of subsequences:

| 1 | A |
|---|---|
| 2 | AB |
| 3 | ABA |
| 4 | ABAAB |
| 5 | ABAABABA |
| 6 | ABAABABAABAAB |

The lines hereinabove indicate that the sequence of of layers shown in FIG. 1 include only generation 6. However, even in this limited portion of the series, the series exhibits quasi-periodicity in that each term in the series, and therefore the sequence of layers, is uniquely determined. However, the translational symmetry characteristic of periodic sequences is absent.

It is a special property of a quasi-periodic sequence that its Fourier spectrum consists of a dense set of Fourier components at every wavevector. This is represented by the following equation:

$$k = \frac{2\pi(m + n\tau)}{\tau d_A + d_B}$$

Where m and n are integers having either positive or negative values, $d_A$ and $d_B$ are the layer thickness, and $\tau$ is the golden mean:

$$\tau = \frac{1 + \sqrt{5}}{2} = 1.618$$

Figure 2:
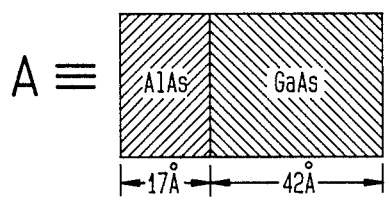
FIG. 2 is a schematic representation of a cross-section of a layer used in the embodiment of FIG. 1.
Figure 3:
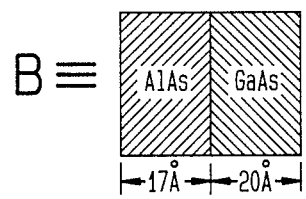
FIG. 3 is a schematic representation of a cross-section of a further layer used in the embodiment of FIG. 1.

FIGS. 2 and 3 are schematic representations of cross-sections of layers A and B respectively. As shown in FIG. 2, layer A is formed of AlAs and GaAs. Layer B is formed of the same material but has a smaller thickness. A major advantage of the coating constructed using the principles of the present invention is shown in the graph of FIG. 4.

Figure 4:
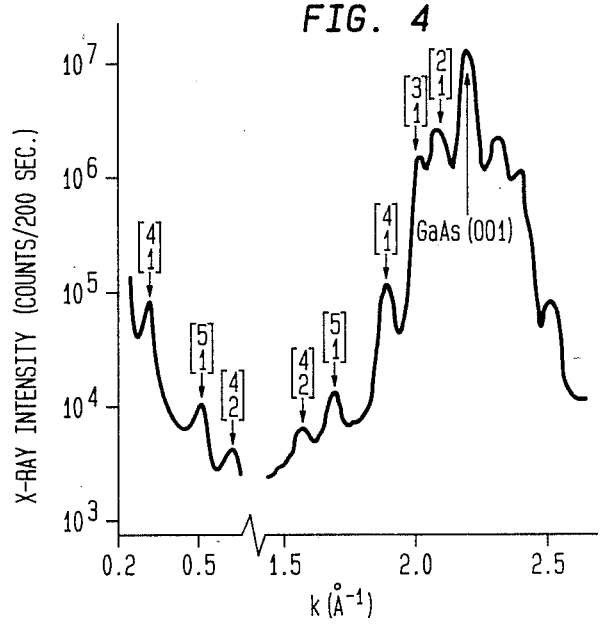

FIG. 4 is a plot of X-ray reflectivity for a quasi-periodic surface coating based upon the constituents shown in FIGS. 2 and 3. As can be seen from this figure, many peaks are overlapping, in conformance with the predicted dense set of Fourier components. The actual appearance of the dense set of Fourier peaks in the diffraction pattern of the surface coating clearly shows that the present application produces results which are different from previous coatings based on single homogenous layers and periodic layers. The actual intensities of the individual components can be tailored, with the use of computer modeling techniques, to particular applications. In general, however, the relative intensities of the Fourier components depends upon the material from which A and B are made, and their relative thicknesses $d_A$ and $d_B$. For applications in the X-ray and hard UV region of the electromagnetic spectrum $d_A$ and $d_B$ should be in the range of 5Å to approximately 500Å. For optical applications, $d_A$ and $d_B$ would be scaled up to be roughly on the order of the wavelength of light, approximately 5000Å. In such an embodiment, layers A and B would be made of dielectric materials such as transparent oxides. Thus, the thicknesses of the individual layers can be scaled to have roughly the same dimensions as the wavelengths of the electromagnetic radiation used in the particular application.

As previously indicated, any of a large variety of coating methods and systems can be used in the implementation of of the invention. Such fabrication methods include, for example, molecular beam epitaxy for very thin layers required for X-ray applications, sputtering, chemical vapor deposition, liquid phase epitaxy, and aerosol coating methods for longer wavelength electromagnetic radiations.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and descriptions in this disclosure are proffered to facilitate comprehension of the invention and should not be construed to limit the scope thereon.

What is claimed is:

1. A process of making an optical coating for reflecting x-ray energy having a predetermined wavelength characteristic, the optical coating being formed of a respective plurality of each of n types of thin film layers, the process comprising the steps of:

first defining the n types of thin film layers, where n is an integer having a value which is at least three, each of the n types of thin film layers being characterized by a respective predetermined thickness in the range of approximately between 5Å and 5000Å and corresponding substantially to the predetermined wavelength characteristic of the x-ray energy;

second defining a selection matrix having n columns by n rows, said selection matrix having a non-zero determinant and a first element equal to unity, for determining a quasi-periodic sequence of said n types of layers; and applying a respective plurality of the n types of thin film layers, said application of said pluralities of said n types of the thin film layers being performed so that respective ones of the n types of the thin film layers are interleaved in accordance with a predetermined sequence of groupings of the thin film layers, each grouping in said predetermined sequence of groupings being configured in response to the configuration of a sequence of a prior grouping of the thin film layers, and in response to said selection matrix which defines the configuration of the sequence of each subsequent grouping.

2. The process of claim 1 wherein said n types of the thin film layers are formed of different materials.

3. The process of claim 2 wherein at least first and second ones of said thicknesses are equal to one another.

4. The process of claim 1 wherein at least first and second types of the thin film layers are formed of GaAs and AlAs, respectively.

5. The process of claim 1 wherein said predetermined thicknesses of said thin film layers are selected to achieve a predetermined reflection-absorption characteristic of the x-ray reflective optical coating in a selected frequency range of the x-ray energy.

6. A method of making an x-ray reflective optical coating of the type having a plurality of each of n types of thin film layers, where n is an integer having a value greater than or equal to three, the n types of thin film layers being arranged in an interleaved layer sequence, the sequence being characterized by being determined in response to a predetermined $n \times n$ layer sequence selection matrix formed of positive matrix elements whereby successive sub-sequences of said thin film layers are selected to form said layer sequence in response to a prior sub-sequence and to said $n \times n$ layer sequence selection matrix, said $n \times n$ layer sequence selection matrix having a non-zero determinant and a first matrix element equal to unity.

7. A method of forming a multilayer, x-ray reflective structure, the method comprising the steps of:

defining a predetermined characteristic for each of n types of thin film layers, where n is an integer having a value of at least three;

defining a predetermined $n \times n$ substitution matrix for specifying successive sequences of said n types of thin film layers, said substitution matrix having a non-zero determinant; and depositing a respective plurality of each of said n types of thin film layers in an interleaved manner having a sequence of said thin film layers which is responsive to said predetermined $n \times n$ substitution matrix.

8. The method of claim 7 wherein said characteristic of at least one of said n types of thin film layers corresponds to layer thickness.

9. The method of claim 7 wherein said characteristic of at least one of said n types of thin film layers corresponds to a layer material.

10. The method of claim 7 wherein said characteristic of at least one of said n types of thin film layers corresponds to a predetermined combination of layer materials.

11. The method of claim 7 wherein said step of depositing comprises deposition by sputtering.

12. The method of claim 7 wherein said step of depositing comprises deposition by molecular beam epitaxy.

13. The method of claim 7 wherein said step of depositing comprises deposition by metallization.

14. The method of claim 7 wherein said step of depositing comprises aerosol deposition.

15. The method of claim 7 wherein said step of depositing comprises a layer growth technique.

16. The method of claim 7 wherein said step of depositing comprises chemical vapor deposition.

17. The method of claim 7 wherein said step of depositing comprises liquid phase epitaxy.

* * * * *